(12) United States Patent
Guda et al.

(10) Patent No.: US 7,933,567 B2
(45) Date of Patent: Apr. 26, 2011

(54) METHOD AND APPARATUS FOR ACHIEVING LINEAR MONOTONIC OUTPUT POWER

(75) Inventors: Srinivas Guda, Hyderabad (IN); Kevin Edward Atkinson, San Diego, CA (US); Amit Butala, Sunnyvale, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 549 days.

(21) Appl. No.: 11/626,134

(22) Filed: Jan. 23, 2007

(65) Prior Publication Data

US 2007/0229330 A1 Oct. 4, 2007

Related U.S. Application Data

(60) Provisional application No. 60/762,661, filed on Jan. 26, 2006.

(51) Int. Cl.
*H01Q 11/12* (2006.01)
*H03C 1/62* (2006.01)

(52) U.S. Cl. .............. 455/126; 455/127.1; 330/133
(58) Field of Classification Search .......... 455/126, 455/127.1–127.3, 69, 522; 330/133
See application file for complete search history.

(56) References Cited

U.S. PATENT DOCUMENTS

| 5,983,085 | A | 11/1999 | Zamata et al. | |
| 6,178,313 | B1 * | 1/2001 | Mages et al. | 455/127.2 |
| 6,215,987 | B1 * | 4/2001 | Fujita | 455/127.3 |
| 6,934,076 | B1 * | 8/2005 | Goobar et al. | 359/337 |
| 2001/0014613 | A1 * | 8/2001 | Bergveld et al. | 455/522 |
| 2006/0160506 | A1 * | 7/2006 | Smentek et al. | 455/127.3 |

FOREIGN PATENT DOCUMENTS

| DE | 10005440 | 8/2001 |
| EP | 0961402 | 12/1999 |
| JP | 11505977 | 5/1999 |
| JP | 200169079 | 3/2001 |
| JP | 2001513972 | 9/2001 |
| JP | 2001332984 | 11/2001 |
| JP | 2002111418 | 4/2002 |
| JP | 2003332919 | 11/2003 |
| JP | 2004500775 | 1/2004 |
| JP | 2005136509 | 5/2005 |
| WO | 9710644 | 3/1997 |
| WO | 9931798 | 6/1999 |
| WO | 0167621 | 9/2001 |

OTHER PUBLICATIONS

Intenational Search Report and Written Opinion—PCT/US07/061169—ISA/EPO—Jun. 13, 2007.

* cited by examiner

*Primary Examiner* — Lee Nguyen
(74) *Attorney, Agent, or Firm* — Kenyon S. Jenckes; Ramin Mobarhan (57) ABSTRACT

Techniques for achieving linear monotonic output power with piecewise non-linear and/or non-monotonic circuits are described. A coarse gain is selected for a first circuit having non-linear and/or non-monotonic characteristics. A fine gain is selected for a second circuit used to account for output power error due to the coarse gain. First and second look-up tables may store output power versus gain for the first and second circuits, respectively. An output power in the first look-up table may be selected based on the requested output power, and the gain corresponding to the selected output power may be provided as the coarse gain. An output power in the second look-up table may be selected based on the output power error, and the gain corresponding to the selected output power may be provided as the second gain.

27 Claims, 6 Drawing Sheets

METHOD AND APPARATUS FOR ACHIEVING LINEAR MONOTONIC OUTPUT POWER

This application claims priority to U.S. Provisional Application No. 60/762,661 filed Jan. 26, 2006 entitled "ACHIEVING LINEAR MONOTONIC OUTPUT POWER FROM A PIECEWISE NON-LINEAR NON-MONOTONIC RF TRANSMIT CIRCUITS."

BACKGROUND

I. Field

The present disclosure relates generally to circuits, and more specifically to techniques for achieving linear monotonic output power from a transmitter.

II. Background

The design of a high performance transmitter is challenging due to various design considerations. First, many applications require high performance, which may be quantified by good linearity, high efficiency, etc. Second, low power consumption and low cost are highly desirable for applications such as wireless communication. In general, high performance and low power/cost impose conflicting design constraints.

In addition to the above design goals, some applications require a transmitter to have a wide range of output power. For example, a transmitter in a Code Division Multiple Access (CDMA) communication system may be required to adjust its output power over a range of approximately 85 decibels (dB) in steps of 1.0±0.5 dB. This wide output power range and small step size are used for closed loop power control. Since each transmitter causes interference to other transmitters in the CDMA system, the closed loop power control adjusts the output power of each transmitter to (1) achieve the desired received signal quality for that transmitter at a receiving base station and (2) minimize interference to other transmitters transmitting to the same base station.

To achieve the wide output power range with the required step resolution, a transmitter may be designed to be piecewise linear and monotonic. A function $f(x)$ is piecewise linear over a range of x values if this range can be partitioned into a finite number of subranges such that for each subrange function $f(x)$ can be represented by a linear function $y=m \times x+b$, where m is a slope, b is an intercept point, and y is an output value. m and b may be different for different subranges. Function $f(x)$ is monotonic if it does not decrease as x increases. The entire output power range may be partitioned into smaller subranges in order to simplify the design of the transmitter. The transmitter is then designed such that the output power is linear and monotonic within each subrange as well as when switching from one subrange to another subrange. Using the function above, x may correspond to a gain control value, and $f(x)$ may correspond to the output power of the transmitter. The transmitter may utilize more complicated circuits, consume more battery power, and/or incur higher cost in order to achieve piecewise linear and monotonic characteristics.

There is therefore a need in the art for techniques to achieve linear monotonic output power even for a transmitter that is not piecewise linear and monotonic.

SUMMARY

Techniques for achieving linear monotonic output power with piecewise non-linear and/or non-monotonic circuits are described herein. In an aspect, a coarse gain is selected for a first circuit having non-linear and/or non-monotonic characteristics, and a fine gain is selected for a second circuit used to account for errors in the coarse gain. The coarse and fine gains can provide a requested output power regardless of the characteristics of the first circuit.

In one design, an apparatus includes first and second units. The first unit receives an input indicative of a requested output power and provides a first gain (or coarse gain) based on the input. The first gain is associated with an output power error from the requested output power. The second unit determines a second gain (or fine gain) based on the output power error. The first gain may be determined based on a non-linear function, a non-monotonic function, or a non-linear and non-monotonic function. The second gain may be determined based on a linear function or a monotonic function.

The first unit may include a first look-up table that stores a function of output power versus gain for the circuit(s) applied with the first gain. The first unit selects an output power in the first look-up table based on (e.g., closest to or next higher than) the requested output power and provides the gain corresponding to the selected output power as the first gain. The first gain may be applied to a transmitter and/or some other circuit. The second unit may include a second look-up table that stores a function of output power versus gain for the circuit(s) applied with the second gain. The second unit selects an output power in the second look-up table based on (e.g., closest to) the output power error and provides the gain corresponding to the selected output power as the second gain. The second gain may be applied to a digital variable gain amplifier (DVGA) and/or some other circuit.

Various aspects and features of the disclosure are described in further detail below.

DETAILED DESCRIPTION

Figure 1:
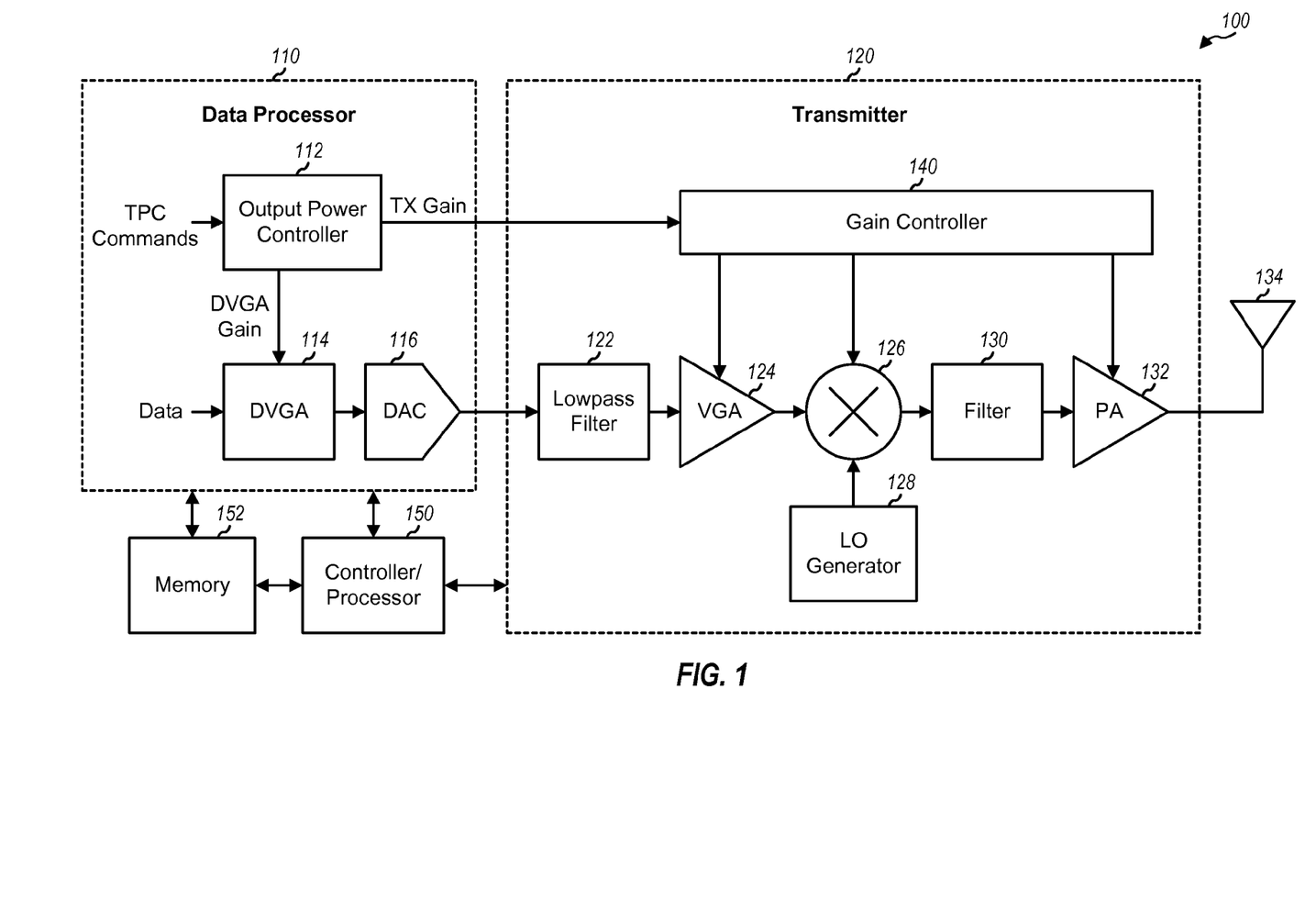
FIG. 1 shows a block diagram of a wireless device.

FIG. 1 shows a block diagram of a wireless device 100 for a wireless communication system. Wireless device 100 may be a cellular phone, a personal digital assistant (PDA), a wireless modem, a handheld device, a subscriber unit, a laptop computer, etc. For simplicity, FIG. 1 shows only the transmit portion of wireless device 100 and does not show the receive portion. Wireless device 100 includes a data processor 110, a transmitter 120, a controller/processor 150, and a memory 152.

Within data processor 110, a digital variable gain amplifier (DVGA) 114 receives data to be transmitted, multiplies the data with a DVGA gain from an output power controller 112, and provides scaled data. A digital-to-analog converter (DAC) 116 converts the scaled data to analog and provides an analog output signal.

Within transmitter 120, the analog output signal is filtered by a lowpass filter 122 to remove images caused by the digital-to-analog conversion, amplified by a variable gain amplifier (VGA) 124, and upconverted from baseband to radio frequency (RF) by a mixer 126. A local oscillator (LO) generator 128 generates an LO signal used for frequency upconversion by mixer 126. The upconverted signal is filtered by a bandpass filter 130 to remove images caused by the frequency upconversion, further amplified by a power amplifier (PA) 132, and transmitted via an antenna 134.

A gain controller 140 receives a transmit (TX) gain from output power controller 112 and generates gain control signals for transmitter circuits such as VGA 124, mixer 126 and/or power amplifier 132. The TX gain may be a digital value having M bits of resolution, where in general M>1 and in one design M=8. The TX gain may be provided to gain controller 140 via a serial bus or some other type of interface. Gain controller 140 may generate the gain control signals for the transmitter circuits such that the output power at antenna 134 varies as linearly as possible for a monotonic increase in the TX gain. For example, gain controller 140 may adjust some transmitter circuits (e.g., power amplifier 132) in large discrete gain steps whenever the TX gain exceeds predetermined thresholds and may adjust some other transmitter circuits (e.g., VGA 124) in smaller gain steps based on the TX gain. Gain controller 140 may use one or more look-up tables to generate the gain control signals.

FIG. 1 shows an example design of a transmitter. In general, the signal conditioning in a transmitter may be performed by one or more stages of amplifier, filter, mixer, etc. These circuits may be arranged differently from the configuration shown in FIG. 1. Furthermore, other circuits not shown in FIG. 1 may also be used for signal conditioning.

Wireless device 100 may be used for various wireless communication systems such as CDMA systems, Frequency Division Multiple Access (FDMA) systems, Time Division Multiple Access (TDMA) systems, Orthogonal FDMA (OFDMA) systems, etc. A CDMA system may utilize a radio technology such as Wideband-CDMA (W-CDMA), cdma2000, etc. cdma2000 covers IS-95, IS-2000, and IS-856 standards. A TDMA system may utilize a radio technology such as Global System for Mobile Communications (GSM). These various radio technologies, standards, and systems are known in the art. Wireless device 100 may also be used for wireless local area networks (WLANs), which may implement the IEEE 802.11 family of standards, some other WLAN standard, or some other WLAN radio technology. For clarity, the following description assumes that wireless device 100 is used for a CDMA system, which may utilize W-CDMA or cdma2000.

Wireless device 100 may be required to vary its output power over a wide range (e.g., approximately 85 dB) in relatively small steps (e.g., 1.0±0.5 dB for W-CDMA and 0.5±0.25 dB for cdma2000). This wide output power range may be achieved by varying the gains of various circuits in transmitter 120. Different output power functions may be achieved for different designs of the transmitter circuits.

As used herein, a linear function is a function defined by the equation y=m×x+b, where x is an input value, m is a slope, b is an intercept point, and y is an output value. A non-linear function is any function that is not a linear function. A monotonic function is a function in which the output increases as the input increases, or the output does not change direction when the input is varied in one direction. A non-monotonic function is any function that is not monotonic.

Figure 2A:
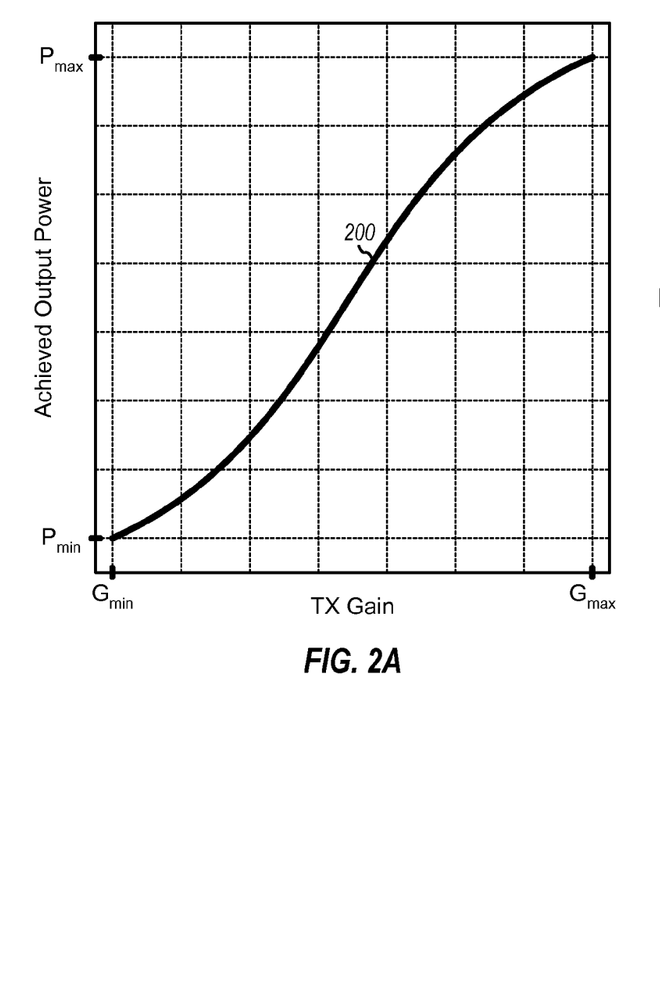
FIG. 2A shows a monotonic output power function.

FIG. 2A shows an example output power function 200 that is smooth and monotonic. Function 200 describes the achieved output power at antenna 134 versus the TX gain from output power controller 112. The minimum output power $P_{min}$ is obtained with the minimum TX gain $G_{min}$. The output power increases monotonically and in a smooth manner as the TX gain increases. The maximum output power $P_{max}$ is obtained with the maximum TX gain $G_{max}$. The shape of function 200 is typically determined by the characteristics of all transmitter circuits having variable gain.

Figure 2B:
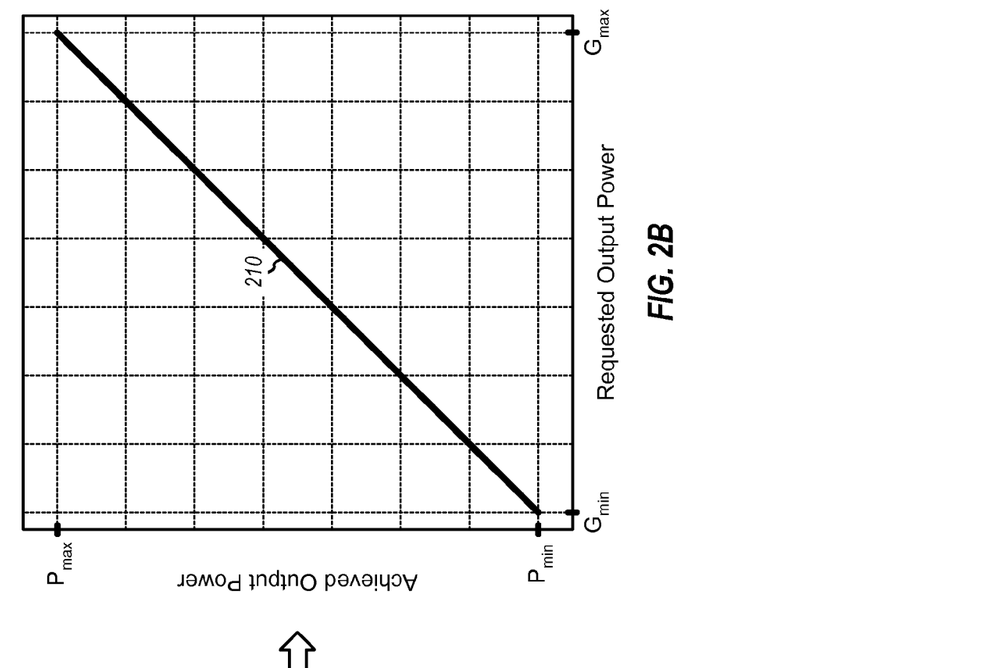
FIG. 2B shows a linear and monotonic output power function.

FIG. 2B shows a desired output power function 210 that is linear and monotonic. Function 210 describes the achieved output power at antenna 134 versus the requested output power. Output power controller 112 may determine the requested output power based on transmit power control (TPC) commands received from a base station. Controller 112 may then generate the TX gain such that the requested output power is achieved at antenna 134. Controller 112 may store a look-up table for function 200. For a given requested output power, controller 112 may determine the TX gain that provides an output power that is closest to the requested output power. Controller 112 may then provide this TX gain to transmitter 120.

The transmitter circuits may be designed and optimized for output power, Adjacent Channel Leakage power Ratio (ACLR), efficiency, cost, etc. ACLR is the ratio of the power centered on an assigned frequency channel to the power centered on an adjacent frequency channel. These design goals may result in an output power function that non-linear and/or monotonic.

Figure 3A:
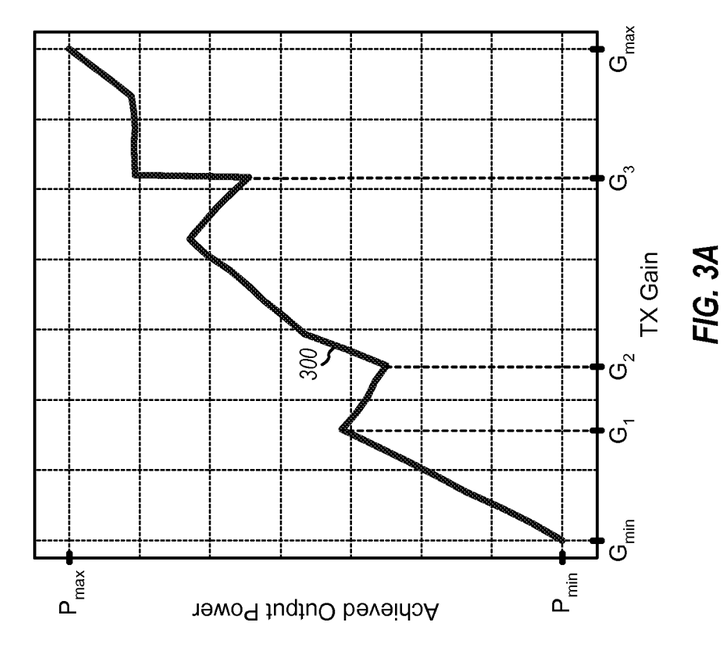
FIG. 3A shows a non-linear and non-monotonic output power function.

FIG. 3A shows an example output power function 300 that is non-linear and non-monotonic. The minimum output power $P_{min}$ is obtained with the minimum TX gain $G_{min}$, and the maximum output power $P_{max}$ is obtained with the maximum TX gain $G_{max}$. However, the output power does not increase monotonically as the TX gain increases from $G_{min}$ to $G_{max}$. As shown in FIG. 3A, the output power increases as the TX gain increases from $G_{min}$ to $G_1$ but then decreases as the TX gain increases further from $G_1$ to $G_2$. Function 300 also includes discontinuity at TX gain of $G_3$ where the output power jumps abruptly. In general, an output power function may include any number of sections that is non-monotonic and any number of points of discontinuity.

Figure 3B:
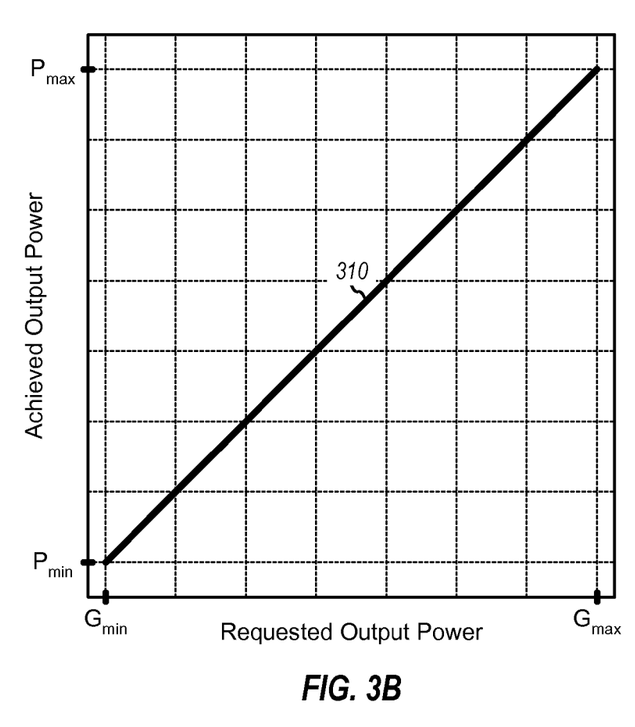
FIG. 3B shows a linear and monotonic output power function.

FIG. 3B shows a desired output power function 310 that is linear and monotonic. It is desirable to achieve linear and monotonic function 310 even when a transmitter has function 300 or some other function that is non-linear and/or non-monotonic.

Linear monotonic output power may be achieved with piecewise non-linear and non-monotonic circuits in various manners. In an aspect, a coarse gain is selected for a first circuit (e.g., transmitter 120) having non-linear and/or non-monotonic characteristics. A fine gain is selected for a second circuit (e.g., DVGA 114) used to account for errors in the coarse gain. The coarse and fine gains can provide the requested output power regardless of the characteristics of the first circuit. For clarity, a specific design for achieving linear monotonic output power is described below.

Figure 4:
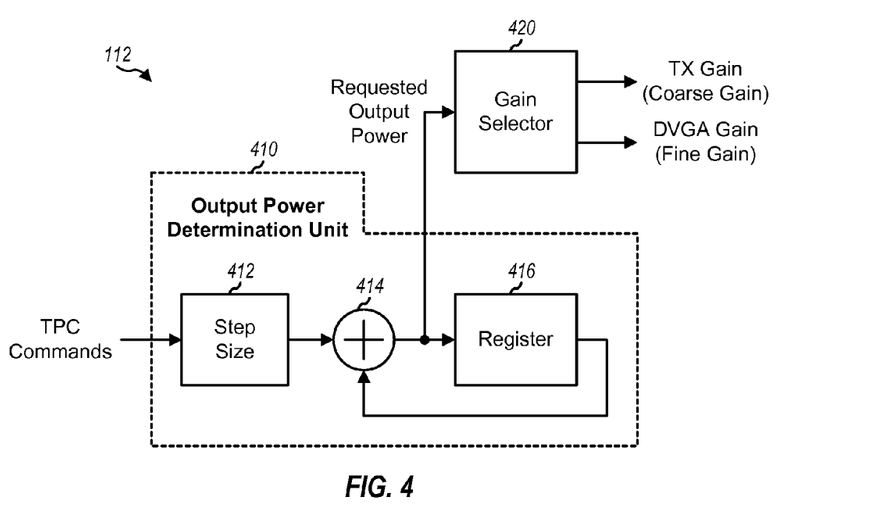
FIG. 4 shows a block diagram of an output power controller.

FIG. 4 shows a block diagram of a design of output power controller 112 in FIG. 1. In this design, controller 112 includes an output power determination unit 410 and a gain selector 420. Unit 410 receives TPC commands and provides the requested output power. Each TPC command may be (1) an up command to increase the output power by an up step or (2) a down command to decrease the output power by a down step. Within unit 410, a step size unit 412 receives each TPC command and provides either the up step (e.g., +1 dB) or the down step (e.g., −1 dB) based on the received TPC command. A summer 414 sums a stored output power from a register 416 with the up or down step from unit 412 and provides the requested output power to both register 416 and gain selector 420. Gain selector 420 receives the requested output power from unit 410 and provides the TX gain (or coarse gain) and the DVGA gain (or fine gain) such that the requested output power is achieved.

Figure 5:
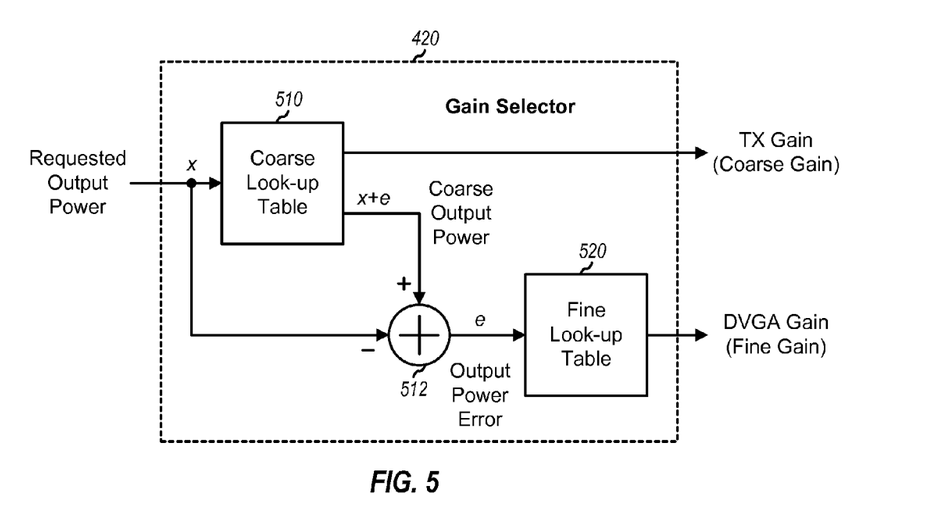
FIG. 5 shows a block diagram of a gain selector.

FIG. 5 shows a block diagram of a design of gain selector 420 in FIG. 4. In this design, a coarse look-up table 510 receives the requested output power (denoted as x) and provides the coarse gain, which is the TX gain for transmitter 120. Table 510 stores the output power function for transmitter 120 and is described in further detail below. The coarse gain provides a coarse output power (denoted as x+e) that may be close to the requested output power. A summer 512 subtracts the requested output power x from the coarse output power x+e and provides an output power error (denoted as e), which is the error in the output power with the coarse gain. A fine look-up table 520 receives the output power error e and provides the fine gain, which is the DVGA gain for DVGA 114. The fine gain compensates for the output power error so that the requested output power is achieved at antenna 134.

Coarse look-up table 510 may store the output power function for transmitter 120. This output power function may be determined by (1) applying different TX gain values and measuring the output power at antenna 134, (2) characterizing output power versus TX gain for a number of transmitters and generating the output power function based on (e.g., as an average of) this characterization, (3) computer simulation, or (4) some other means. The output power function may not need to be accurately determined when used in closed loop power control. To reduce storage requirement, look-up table 510 may store only a subset of points for the output power function, e.g., for evenly spaced TX gain values.

Table 1 shows a design of coarse look-up table 510 for output power function 300 in FIG. 3A. In this design, the TX gain is given by an 8-bit digital value that ranges from 0 to 255. The entire range of TX gain is partitioned into 32 bins that are numbered from 0 through 31. Each bin covers 8 consecutive TX gain values. For example, bin 0 covers TX gain values 0 to 7, bin 1 covers TX gain values 8 to 15, etc. Table 510 stores the output power for each of 32 TX gain values for the 32 bins, or more specifically the output power for the last TX gain value in each bin. The output power is given in 10-bit digital format as well as in dBm. The conversion between the 10-bit digital format and dBm is such that −60 dBm is represented by a 10-bit digital value of 0, and each 1 dBm step corresponds to 12 least significant bit (LSB) steps in the 10-bit digital format. For example, in Table 1, a TX gain of 87 in bin 10 corresponds to an output power of −27.4 dBm, which is represented by a 10-bit digital value of 391. Coarse look-up table 510 may store only the digital output power values in columns 3 and 7 and not the dBm output power values in columns 4 and 8.

TABLE 1

| Coarse look-up table | | | |
|---|---|---|---|
| Bin | TX Gain (digital) | Output Power (digital) | Output Power (dBm) |
| 0 | 7 | 4 | −59.7 |
| 1 | 15 | 67 | −54.4 |
| 2 | 23 | 130 | −49.2 |
| 3 | 31 | 202 | −43.2 |
| 4 | 39 | 262 | −38.2 |
| 5 | 47 | 326 | −32.8 |

TABLE 1-continued

| Coarse look-up table | | | |
|---|---|---|---|
| Bin | TX Gain (digital) | Output Power (digital) | Output Power (dBm) |
| 6 | 55 | 393 | −27.3 |
| 7 | 63 | 459 | −21.8 |
| 8 | 71 | 430 | −24.2 |
| 9 | 79 | 406 | −26.2 |
| 10 | 87 | 391 | −27.4 |
| 11 | 95 | 367 | −29.4 |
| 12 | 103 | 447 | −22.8 |
| 13 | 111 | 537 | −15.3 |
| 14 | 119 | 578 | −11.8 |
| 15 | 127 | 618 | −8.5 |
| 16 | 135 | 652 | −5.7 |
| 17 | 143 | 690 | −2.5 |
| 18 | 151 | 737 | 1.4 |
| 19 | 159 | 774 | 4.5 |
| 20 | 167 | 742 | 1.8 |
| 21 | 175 | 714 | −0.5 |
| 22 | 183 | 683 | −3.1 |
| 23 | 191 | 652 | −5.7 |
| 24 | 199 | 887 | 13.9 |
| 25 | 207 | 889 | 14.1 |
| 26 | 215 | 886 | 13.8 |
| 27 | 223 | 888 | 14.0 |
| 28 | 231 | 895 | 14.6 |
| 29 | 239 | 935 | 17.9 |
| 30 | 247 | 977 | 21.4 |
| 31 | 255 | 1021 | 25.1 |

In general, coarse look-up table 510 may store any number of entries for any number of TX gain or output power values. The output power values stored in coarse look-up table 510 are determined by the characteristics of the circuits used to provide variable gain. Different circuits and different circuit designs may have different characteristics, and the resultant output power functions may or may not be linear and monotonic. The TX gain and output power may also be represented in other formats with some other number of bits.

Fine look-up table 520 may store a function of output power error versus gain for DVGA 114. DVGA 114 may be a digital multiplier that multiplies a digital data value with a digital gain value and provides a digital output value to DAC 116. In this case, DVGA 114 has a linear and monotonic function that is well defined.

Table 2 shows a design of fine look-up table 520. In this design, the output power is given by a 7-bit digital value that ranges from 0 to 72, with 0 corresponding to 0 dBm, 12 corresponding to −1 dBm, etc. Each 1 dBm step in output power thus corresponds to 12 LSB steps in the 7-bit digital format. For each output power value stored in Table 2, the DVGA gain that achieves that output power is given in linear format as well as 10-bit digital format. The 10-bit digital DVGA gain ranges from 0 to to 1023, with 1024 (which is not representable with 10 bits) corresponding to a maximum linear gain of 1.000. For example, a digital output power value of 13 corresponds to −1.0833 dBm, which may be achieved with a linear gain of 0.883 or a corresponding 10-bit digital gain of 904 for DVGA 114. Fine look-up table 520 may store just the digital gain values in columns 3, 6 and 9 and not the linear gain values in columns 2, 5 and 8.

TABLE 2

Fine look-up table

| Output Power (digital) | DVGA Gain (linear) | DVGA Gain (digital) |
|---|---|---|
| 0 | 1.000 | 1024 |
| 1 | 0.990 | 1014 |
| 2 | 0.981 | 1005 |
| 3 | 0.972 | 995 |
| 4 | 0.962 | 985 |
| 5 | 0.953 | 976 |
| 6 | 0.944 | 967 |
| 7 | 0.935 | 957 |
| 8 | 0.926 | 948 |
| 9 | 0.917 | 939 |
| 10 | 0.909 | 930 |
| 11 | 0.900 | 921 |
| 12 | 0.891 | 913 |
| 13 | 0.883 | 904 |
| 14 | 0.874 | 895 |
| 15 | 0.866 | 887 |
| 16 | 0.858 | 878 |
| 17 | 0.850 | 870 |
| 18 | 0.841 | 862 |
| 19 | 0.833 | 853 |
| 20 | 0.825 | 845 |
| 21 | 0.818 | 837 |
| 22 | 0.810 | 829 |
| 23 | 0.802 | 821 |
| 24 | 0.794 | 813 |
| 25 | 0.787 | 806 |
| 26 | 0.779 | 798 |
| 27 | 0.772 | 790 |
| 28 | 0.764 | 783 |
| 29 | 0.757 | 775 |
| 30 | 0.750 | 768 |
| 31 | 0.743 | 761 |
| 32 | 0.736 | 753 |
| 33 | 0.729 | 746 |
| 34 | 0.722 | 739 |
| 35 | 0.715 | 732 |
| 36 | 0.708 | 725 |
| 37 | 0.701 | 718 |
| 38 | 0.694 | 711 |
| 39 | 0.688 | 704 |
| 40 | 0.681 | 698 |
| 41 | 0.675 | 691 |
| 42 | 0.668 | 684 |
| 43 | 0.662 | 678 |
| 44 | 0.656 | 671 |
| 45 | 0.649 | 665 |
| 46 | 0.643 | 659 |
| 47 | 0.637 | 652 |
| 48 | 0.631 | 646 |
| 49 | 0.625 | 640 |
| 50 | 0.619 | 634 |
| 51 | 0.613 | 628 |
| 52 | 0.607 | 622 |
| 53 | 0.601 | 616 |
| 54 | 0.596 | 610 |
| 55 | 0.590 | 604 |
| 56 | 0.584 | 598 |
| 57 | 0.579 | 593 |
| 58 | 0.573 | 587 |
| 59 | 0.568 | 581 |
| 60 | 0.562 | 576 |
| 61 | 0.557 | 570 |
| 62 | 0.552 | 565 |
| 63 | 0.546 | 559 |
| 64 | 0.541 | 554 |
| 65 | 0.536 | 549 |
| 66 | 0.531 | 544 |
| 67 | 0.526 | 538 |
| 68 | 0.521 | 533 |
| 69 | 0.516 | 528 |
| 70 | 0.511 | 523 |
| 71 | 0.506 | 518 |

In general, fine look-up table 520 may store any number of entries for any number of gain values. The range of output power in fine look-up table 520 should be greater than the largest difference between any two consecutive output power values in coarse look-up table 510. This ensures that the fine gain can account for the worst-case output power error due to the coarse gain. The gain and output power may also be represented in other formats and/or with some other number of bits.

In the designs described above, the output power functions are stored in look-up tables. The output power functions may also be implemented in other manners, e.g., with logic and/or other circuit blocks.

In the designs described above, output power is represented by 10-bit digital format having a scale of 12 LSB steps for each 1 dBm in output power. Referring back to FIG. 4, output power determination unit 410 may provide the requested output power in this 10-bit digital format. For each received TPC command, unit 412 may provide a value of +12 for +1 dB increase in output power or a value of −12 for 1 dB decrease in output power. Summer 414 may accumulate the digital value from unit 412 with the stored value from register 416 and provide the requested output power in 10-bit digital format.

The operation of gain selector 420 in FIG. 5 may be illustrated by an example. In this example, the requested output power is a 10-bit digital value of 623, which corresponds to −8.083 dBm. Coarse look-up table 510 receives the requested output power value of 623 and provides, e.g., the closest output power value that is larger than the requested output power. For this example, coarse look-up table 510 would indicate that bin 16 with a 10-bit output power value of 652, which corresponds to −5.7 dBm, is the next higher output power value. Coarse look-up table 510 then provides a TX gain value of 135 and an output power value of 652 for the selected bin. Summer 512 subtracts the requested output power value of 623 from the output power value of 652 and provides an output power error of 29 to fine look-up table 520. Fine look-up table 520 then provides a DVGA gain value of 775 corresponding to the output power error of 29.

Transmitter 120 receives the TX gain value of 135 and provides an overall gain that would achieve an output power of approximately −5.7 dBm, which would be 2.38 dBm higher than the requested output power of −8.083 dBm. However, DVGA 114 receives the DVGA gain value of 775 and scales the digital data lower by approximately 2.42 dB. Hence, DVGA 114 compensates for the output power error in transmitter 120 by scaling the digital data by approximately the same amount (in dB) but in the opposite direction. Consequently, the requested output power is achieved at antenna 134 even with the output power error in transmitter 120.

For clarity, specific designs of the transmitter, DVGA, and coarse and fine look-up tables have been described above. The DVGA has a linear and monotonic function and is used to compensate for output power error in the transmitter, which has a non-linear and non-monotonic function. In general, any analog or digital circuit or any combination of analog and/or digital circuits may be used to compensate for output power error. The circuit(s) used for compensation may or may not have a linear and monotonic function but should have a predictable response.

Figure 6:
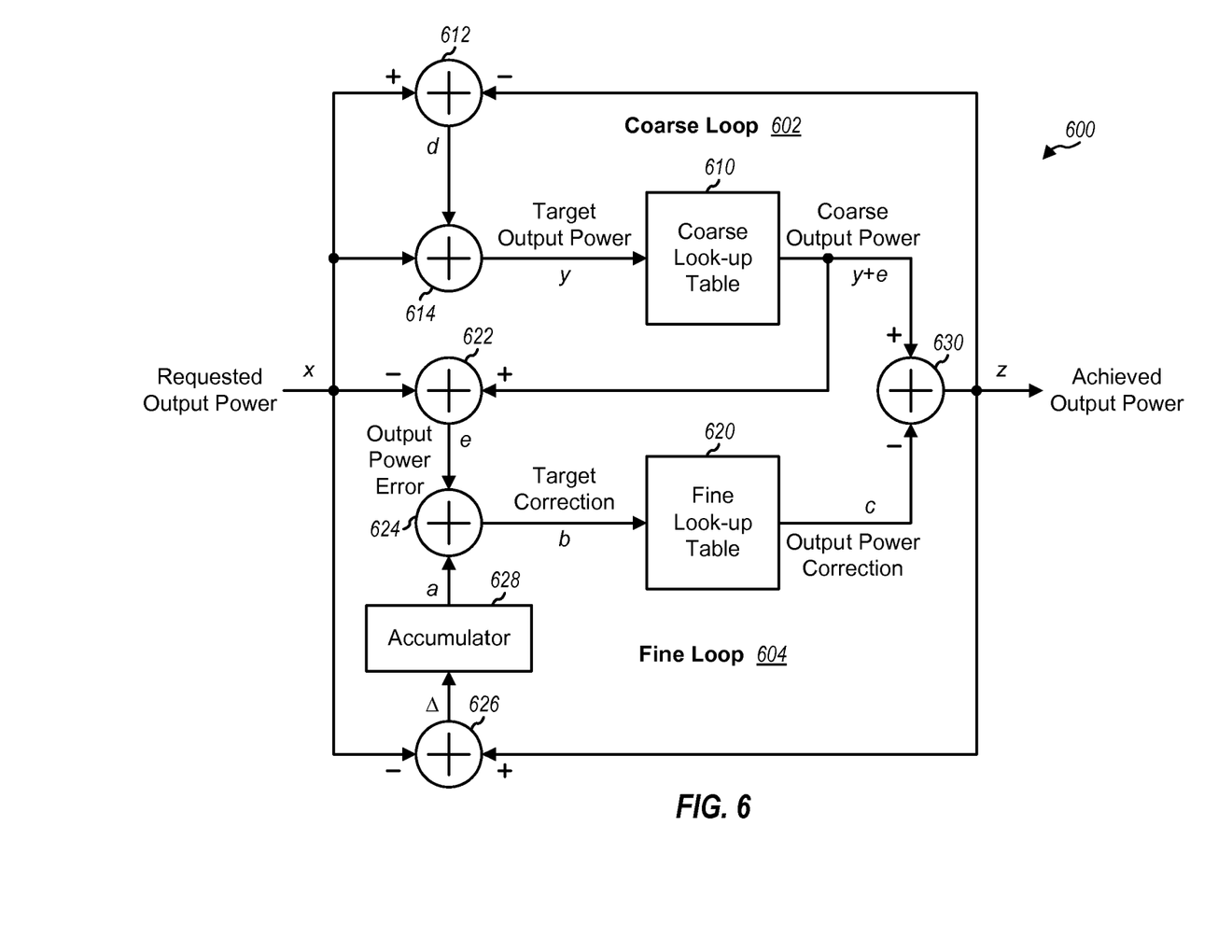
FIG. 6 shows a block diagram of a dual-loop output power setting unit.

FIG. 6 shows a block diagram of a dual-loop output power setting unit 600 that includes a coarse loop 602 and a fine loop 604. Coarse loop 602 includes a coarse look-up table 610 that stores an output power function for circuits used for coarse gain/output power control. The coarse output power function may be non-linear and/or non-monotonic. Fine loop 604 includes a fine look-up table 620 that stores an output power function for circuits used for fine gain/output power control. The fine output power function is monotonic and may or may not be linear. Coarse loop 602 selects a coarse output power that is close to a requested output power x. Fine loop 604 selects an output power correction that compensates for the output power error from coarse loop 602.

For coarse loop 602, a summer 612 subtracts the achieved output power z from the requested output power x and provides an output power difference d. A summer 614 sums the requested output power x and the output power difference d and provides a target output power y. Coarse look-up table 610 receives the target output power y and provides the coarse output power y+e, which may be the output power in the look-up table that is closest to the target output power or the next higher output power.

When the achieved output power z is equal to the requested output power x, the output power difference d is zero, and the target output power y is equal to the requested output power x, or z=x, d=0, and y=x. In this case, coarse look-up table 610 provides the coarse output power corresponding to the requested output power x, and the output power error e is due to the circuits characterized by coarse look-up table 610. If there are any errors in the achieved output power z, then the output power difference d is added to the requested output power x and used to select a coarse output power that reduces the output power difference d. Coarse loop 602 attempts to correct for the output power difference d.

For fine loop 604, a summer 622 subtracts the requested output power x from the coarse output power y+e and provides the output power error e. A summer 626 subtracts the requested output power x from the achieved output power z and provides an output power delta $\Delta$. An accumulator 628 accumulates the output power delta $\Delta$ and provides an accumulated error $\alpha$. A summer 624 sums the output power error e with the accumulated error $\alpha$ and provides a target correction b. Fine look-up table 620 receives the target correction b and provides an output power correction c, which may be the output power in the look-up table that is closest to the target correction. A summer 630 subtracts the output power correction c from the coarse output power y+e and provides the achieved output power z.

Initially, the output of accumulator 628 is zero. Fine look-up table 620 receives the output power error e and provides the corresponding output power correction c. If the output power correction c is equal to the output power error e, then the output power delta $\Delta$ is zero, and the output of accumulator 628 remains at zero. However, if the output power correction c is not equal to the output power error e (e.g., because the output power function stored in fine look-up table 620 is not linear), then the output power delta $\Delta$ is non-zero. Accumulator 628 accumulates the output power delta $\Delta$ and adjusts the target correction b with the accumulated error $\alpha$ such that the output power correction c is equal to the output power error e. Fine loop 604 thus compensates for the output power error e from the coarse output power function stored in look-up table 610 and further accounts for non-linearity in the fine output power function stored in look-up table 620.

FIG. 6 shows a specific design of a dual-loop output power setting unit. In general, multiple loops may be implemented in various manners and may also be coupled in various manners. For example, in another design, summers 612 and 614 in coarse loop 602 are removed, and the requested output power x is provided directly to coarse look-up table 610. In yet another design, summers 624 and 626 and accumulator 628 in fine loop 604 are removed, and the output power error e from summer 622 is provided directly to fine look-up table 620. Other designs may also be implemented.

Unit 600 may be used for gain selector 420 in FIG. 4. In this case, coarse look-up table 610 provides a coarse gain corresponding to the coarse output power y+e, and fine look-up table 620 provides a fine gain corresponding to the output power correction c.

In general, coarse gain/output power adjustment may be achieved with any suitable circuits, e.g., non-linear and/or non-monotonic transmitter circuits having a large dynamic range. Fine gain/output power adjustment may also be achieved with any suitable circuits, e.g., baseband and/or RF circuits having a smaller dynamic range but higher accuracy. The coarse loop tunes the high dynamic circuits to an output power that may be close to the desired output power. The finer loop tunes the low dynamic range circuits to achieve the desired output power.

The techniques described herein allow for use of circuits that may not be linear and/or monotonic. This allows the circuits to be optimized for low current consumption, high efficiency, good dynamic range, low cost, etc. Low current consumption and high efficiency may improve battery life and extend both talk time and standby time, which is desirable for wireless and mobile applications.

Figure 7:
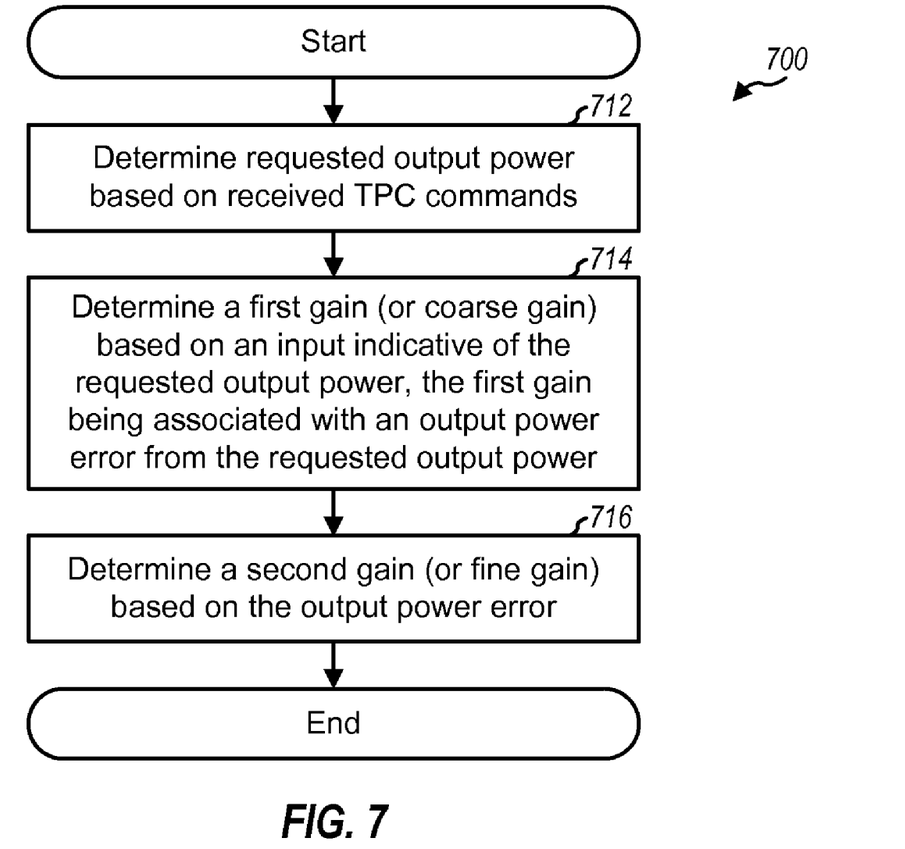
FIG. 7 shows a process for selecting gain/output power.

FIG. 7 shows a process 700 for selecting gain/output power. A requested output power is determined based on received TPC commands (block 712). A first gain (or coarse gain) is determined based on an input indicative of the requested output power (block 714). The input may be any representation of the requested output power, e.g., the digital representation shown in Table 1. The first gain is associated with an output power error from the requested output power. A second gain (or fine gain) is determined based on the output power error and is used to compensate for the output power error (block 716). The first gain may be determined based on a non-linear function, a non-monotonic function, or a non-linear and non-monotonic function covering a first range of output power. The second gain may be determined based on a linear function or a monotonic function covering a second range of output power that is a fraction of the first range.

For block 714, an output power in a first look-up table of output power versus gain may be selected based on the requested output power. The selected output power may be the closest output power or the next higher output power than the requested output power. The gain corresponding to the selected output power is provided as the first gain. The first gain may be applied to a transmitter and/or some other circuit.

For block 716, an output power in a second look-up table of output power versus gain may be selected based on the output power error. The selected output power may be the closest output power to the output power error. The gain corresponding to the selected output power is provided as the second gain. The second gain may be applied to a DVGA, a VGA, and/or some other circuit.

The techniques described herein may be implemented by various means. For example, these techniques may be implemented in hardware, firmware, software, or a combination thereof. For a hardware implementation, the units used to select gain/output power (e.g., output power controller 112 in FIGS. 1 and 4, gain selector 420 in FIG. 5, and output power setting unit 600 in FIG. 6) may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, electronic devices, other electronic units designed to perform the functions described herein, or a combination thereof.

For a firmware and/or software implementation, the techniques may be implemented with modules (e.g., procedures, functions, and so on) that perform the functions described herein. The firmware and/or software codes may be stored in a memory (e.g., memory 152 in FIG. 1) and executed by a processor (e.g., processor 150). The memory may be implemented within the processor or external to the processor.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus comprising:
a first unit to receive an input indicative of a requested output power and to provide a first gain based on the input, the first gain being associated with an output power error from the requested output power; and
a second unit to determine a second gain based on the output power error, the first and second gains respectively controlling connected first and second amplifiers configured to amplify data to be transmitted.

2. The apparatus of claim 1, wherein the first unit comprises a look-up table to store output power versus gain, and wherein the first unit selects an output power in the look-up table based on the requested output power and provides a gain corresponding to the selected output power as the first gain.

3. The apparatus of claim 2, wherein the selected output power is an output power in the look-up table that is next higher than the requested output power.

4. The apparatus of claim 2, wherein the selected output power is an output power in the look-up table that is closest to the requested output power.

5. The apparatus of claim 1, further comprising:
a summer to subtract the requested output power from an output power corresponding to the first gain and to provide the output power error.

6. The apparatus of claim 1, wherein the second unit comprises a look-up table to store output power versus gain, and wherein the second unit selects an output power in the look-up table based on the output power error and provides a gain corresponding to the selected output power as the second gain.

7. The apparatus of claim 6, wherein the selected output power is an output power in the look-up table that is closest to the output power error.

8. The apparatus of claim 1, wherein the first gain is determined based on a non-linear function, a non-monotonic function, or a non-linear and non-monotonic function.

9. The apparatus of claim 1, wherein the second gain is determined based on a linear function or a monotonic function.

10. The apparatus of claim 1, wherein the first unit selects the first gain based on a first function covering a first range of output power, and wherein the second unit selects the second gain based on a second function covering a second range of output power that is a fraction of the first range.

11. The apparatus of claim 1, further comprising:
a third unit to receive transmit power control (TPC) commands and to determine the requested output power based on the received TPC commands.

12. The apparatus of claim 1, wherein the first gain is applied to a transmitter.

13. The apparatus of claim 1, wherein the second gain is applied to one of the first and second amplifiers configured as a digital variable gain amplifier (DVGA).

14. A method comprising:
determining in a controller a first gain based on an input indicative of a requested output power, the first gain being associated with an output power error from the requested output power; and
determining a second gain based on the output power error, the first and second gains respectively controlling connected first and second amplifiers configured to amplify data to be transmitted.

15. The method of claim 14, wherein the determining the first gain comprises selecting an output power in a look-up table based on the requested output power, the look-up table storing output power versus gain, and providing a gain corresponding to the selected output power as the first gain.

16. The method of claim 14, wherein the determining the second gain comprises selecting an output power in a look-up table based on the output power error, the look-up table storing output power versus gain, and providing a gain corresponding to the selected output power as the second gain.

17. The method of claim 14, further comprising:
determining the requested output power based on transmit power control (TPC) commands.

18. An apparatus comprising:
means for determining a first gain based on an input indicative of a requested output power, the first gain being associated with an output power error from the requested output power; and
means for determining a second gain based on the output power error, the first and second gains respectively controlling connected first and second amplifiers configured to amplify data to be transmitted.

19. The apparatus of claim 18, wherein the means for determining the first gain comprises means for storing a look-up table of output power versus gain, means for selecting an output power in the look-up table based on the requested output power, and means for providing a gain corresponding to the selected output power as the first gain.

20. The apparatus of claim 18, wherein the means for determining the second gain comprises means for storing a look-up table of output power versus gain, means for selecting an output power in the look-up table based on the output power error, and means for providing a gain corresponding to the selected output power as the second gain.

21. The apparatus of claim 18, further comprising:
means for determining the requested output power based on transmit power control (TPC) commands.

22. A computer program product, comprising:
computer-readable medium comprising:
code for causing a computer to determine a first gain based on an input indicative of a requested output power, the first gain being associated with an output power error from the requested output power; and
code for causing a computer to determine a second gain based on the output power error, the first and second gains respectively controlling connected first and second amplifiers configured to amplify data to be transmitted.

23. An apparatus comprising:
a first loop to determine a first gain based on a requested output power; and
a second loop to determine a second gain based on an output power error between the requested output power and an output power achieved with the first gain, the first and second gains respectively controlling connected first and second amplifiers configured to amplify data to be transmitted.

24. The apparatus of claim 23, wherein the first loop comprises a first look-up table to store a first function of output power versus gain, and wherein the first loop selects an output power in the first look-up table based on the requested output power and provides a gain corresponding to the selected output power as the first gain.

25. The apparatus of claim 24, wherein the second loop comprises a second look-up table to store a second function of output power versus gain, and wherein the second loop selects an output power in the second look-up table based on the output power error and provides a gain corresponding to the selected output power as the second gain.

26. The apparatus of claim 23, wherein the first loop determines a target output power based on the requested output power and an achieved output power with the first and second gains and further determines the first gain based on the target output power.

27. The apparatus of claim 23, wherein the second loop determines a target correction based on the requested output power, the coarse output power, and an achieved output power with the first and second gains and further determines the second gain based on the target correction.

* * * * *